United States Patent [19]

Kazerounian et al.

[11] Patent Number: 5,151,375
[45] Date of Patent: Sep. 29, 1992

[54] EPROM VIRTUAL GROUND ARRAY

[75] Inventors: Reza Kazerounian, Alameda; Boaz Eitan, Sunnyvale; Rustom F. Irani, Santa Clara, all of Calif.

[73] Assignee: Waferscale Integration, Inc., Fremont, Calif.

[21] Appl. No.: 537,553

[22] Filed: Jun. 13, 1990

[51] Int. Cl.⁵ .................. H01L 21/285; H01L 21/76
[52] U.S. Cl. ........................................ 437/43; 437/52
[58] Field of Search ................ 437/43, 52; 357/23.14

[56] References Cited

U.S. PATENT DOCUMENTS

| 4,267,632 | 5/1981 | Shappir | 437/52 |
| 4,635,347 | 1/1987 | Lien | 437/43 |
| 4,698,900 | 10/1987 | Esquivel | 437/52 |
| 4,720,323 | 1/1988 | Sato | 437/43 |
| 4,749,443 | 6/1988 | Mitchell | 437/52 |
| 4,795,719 | 1/1989 | Eitan | 437/52 |
| 4,806,201 | 2/1989 | Mitchell | 437/43 |
| 4,833,514 | 5/1989 | Esquivel | 437/52 |

FOREIGN PATENT DOCUMENTS

| 0103352 | 6/1984 | Japan | 437/52 |
| 0186477 | 8/1988 | Japan | 437/52 |

Primary Examiner—Olik Chaudhuri
Assistant Examiner—Ourmazd S. Ojan
Attorney, Agent, or Firm—Skjerven, Morrill, MacPherson, Franklin & Friel

[57] ABSTRACT

An electrically programmable read only memory contains alternating metal bit lines and diffused bit lines. Each diffused bit line is broken into a plurality of segments. Each of the segments of the diffused bit line comprises a virtual source. A multiplicity of floating gate transistors are arranged in rows and columns. The floating gate transistors in each column are divided into M groups of N floating gate transistors each. The floating gate transistors in the $n^{th}$ and the $(n+1)^{th}$ columns, where n is an odd integer given by $1 \leq n \leq N$ and $(N+1)$ is the maximum number of columns in the array are connected to the segments of one diffused bit line placed between the $n^{th}$ and the $(n+1)^{th}$ columns. At least one first transfer transistor is arranged to connect one segment comprising a virtual source to a first metal bit line. The first metal bit line functions as the source for the N floating gate transistors in the $(n+1)^{th}$ column connected to said one segment. At least one second transfer transistor connects the same one segment comprising a virtual source to a second metal bit line. The second metal bit line functions as a source for the N floating gate transistors in the $n^{th}$ column connected to said one segment. The removal of each select transistor from the cell where it previously resided in series with its corresponding floating gate transistor, and the combining of a plurality of select transistors into one select transistor substantially reduces the area taken by each memory cell in the array.

8 Claims, 14 Drawing Sheets

EPROM VIRTUAL GROUND ARRAY

BACKGROUND OF THE INVENTION

1. Field of the Invention

This invention relates to an EPROM array and in particular to an EPROM array which utilizes a virtual ground in such a manner as to substantially reduce the size of each cell in the array to make possible a much smaller integrated circuit for a given array size than heretofore possible.

2. Prior Art

Extensive efforts have been made to shrink the cell size in electrically programmable read only memories, called "EPROMS". In general, the smaller the cell size the smaller the integrated circuit die or chip containing a given number of EPROM cells and therefore the higher the yield of useful semiconductor dice in the manufacturing process. Moreover, because a smaller cell size results in a smaller integrated circuit die for a given size EPROM array, more semiconductor die can be obtained from a given sized wafer and thus the manufacturing cost per die is lower. Accordingly, efforts have been made to reduce EPROM cell size and thus the die size of a semiconductor chip containing a given size EPROM array. A general trend in the industry to improve the EPROM packing density is to apply a virtual ground architecture rather than common ground architecture to the EPROM array. The virtual ground approach eliminates much of the overhead area in the array associated with contacts and source lines. One such effort is shown, for example, in U.S. Pat. No. 4,267,632. In the '632 patent a first plurality of parallel, spaced-apart, polycrystalline silicon ("polysilicon") lines is defined on one surface of, but insulated from the silicon semiconductor substrate. Parallel, spaced apart doped regions are formed in the silicon substrate between these first polysilicon lines in alignment with these lines. A second plurality of parallel, spaced-apart, polysilicon lines insulated from the first lines and the doped regions in the substrate is formed perpendicular to the first lines and the doped regions. The second lines are then used as an etch mask to remove those portions of the first lines not covered by the second lines. The portions of the first lines remaining beneath the second lines are located between the doped regions and are the floating gates of the EPROM transistors. While the '632 patent yields a plurality of floating gate devices in a relatively high density array, the cell size is still larger than desired. One reason for this is that one metal line is formed above each elongated doped region in the silicon substrate. Consequently, the size of the array is increased both by the widths of these metal lines and by the need to have numerous contacts (which of necessity are wider than the widths of the metal lines) between such metal lines and the underlying elongated, parallel, spaced-apart doped regions. Having a symmetrical transistor (source and drain are interchangeable) complicates the programming function in virtual ground arrays. To compensate for this complication a much more complicated Y-decoder is required. This complicated Y-decoder increases the chip size. Moreover, due to the drain turn-on problem (coupling of drain voltage into the floating gate and making the EPROM cell leak current even when $V_G=0$), the EPROM cell has a longer channel length than the minimum channel length possible using the technology. This in turn increases cell size and compromises the cell performance.

To resolve some of the above problems a split gate non-volatile EPROM array is disclosed in U.S. Pat. No. 4,639,893 issued Jan. 27, 1987 on an application of Eitan filed May 15, 1984. In Eitan's invention a memory cell contains both a control gate and a floating gate. The floating gate is self-aligned to the drain region but the control gate is not self-aligned. Eitan teaches that the portion of the transistor channel length beneath the floating gate is defined by the floating gate itself regardless of any processing misalignments thereby insuring a constant channel length under the floating gate. This is achieved by using the floating gate to define one edge of the drain region (i.e. to self-align one edge of the drain to one edge of the floating gate). In the process disclosed by Eitan to make the self-aligned split gate structure, the source region is defined at the same time as the drain region but the alignment of the source region relative to the floating gate is not critical so long as the source region does not underlie and is spaced from the floating gate.

Eitan's split gate transistor thus achieves a channel region beneath the floating gate with a precisely defined length independent of manufacturing tolerances and a remaining relatively imprecisely defined channel region beneath a control gate electrode (which is part of the word line) between the floating gate and the source region.

An advantage of the Eitan structure is that any misalignment between the floating gate and the source region is covered by the control gate and has little effect on the operation of the memory cell while at the same time the floating gate is self-aligned to the drain region.

The asymmetrical split gate cell of Eitan described above overcomes the program disturb as well as the drain turn on associated with the symmetrical EPROM cell in the above-described virtual ground array.

The split gate structure of the '893 patent requires a pair of transistors in each cell: a floating gate transistor for use in storing a bit of information and a control transistor. Both the floating gate and the control transistors are in series between the source and drain of the composite structure. The control transistor takes space and thus increases cell size relative to the size of a cell with just a floating gate transistor.

In the '632 patent a metal line must be formed over every diffusion bit-line to contact the diffusion bit-line at selected places along its length. Due to the small number of contacts (one every 32 cells or one every 64 cells) the metal pitch with contact can be packed better by staggering the contacts. However, the cell pitch is still limited by the metal pitch which is always wider than the minimum design rule possible due to lithography only.

There are two ways to increase the density of EPROMS. One way is to reduce and shrink design rules. The other way is to come up with architectural improvements. FIG. 1 shows that the density of EPROMS has doubled just about every 1.8 years. FIG. 2 shows that cell size (in area dimensions) did not decrease at the same rate and only halved every 3.5 years. As a result, the EPROM chip size has increased dramatically from 170 mils square for a 256k EPROM around 1981 to 360 to 380 mils square for a 4 megabit EPROM in 1989. FIG. 2 shows that the theoretical minimum cell size is about 2.5 to 3 times smaller than the standard cell size with the same design rules. Minimum theoretical cell size shown in FIG. 2 is related to a minimum feature size. Traditionally the minimum feature size corresponds to the minimum width of a line and the minimum spacing between two such lines. Theoretically if 0.8 micron is the minimum width for a polycrystalline silicon line and 0.8 micron is the minimum pitch between two polycrystalline silicon lines, then a square 1.6 microns on a side is possible. Typically when one defines a minimum feature size for a technology it will be the polycrystalline silicon which actually has the minimum feature size. Furthermore, typically the minimum diffusion is 1.3 to 1.5 times larger than the minimum feature size of the polycrystalline silicon while the metal plus contact is 1.5 to 2.0 times larger than the minimum feature size. To approach the theoretical minimum size with an EPROM cell, one has to define a cell which is "poly pitch limited" i.e., which has its minimum features defined by the polycrystalline silicon rather than by the diffusion or the metal and contact dimensions.

FIG. 3 illustrates the prior art standard EPROM layout in top view. The critical design rules involve the Y-pitch (taken along the X axis) which consists of the metal plus the contact pitch and the X-pitch (taken along the Y axis) which reflects half a shared drain contact, the distance from the drain contact to the double poly, the minimum poly pitch and half a diffusion pitch for the shared source line. In a 0.8 micron technology, the cell size will be around 7.5 microns square.

FIG. 4 illustrates the layout of a prior art symmetrical virtual ground EPROM. In FIG. 4 the critical design rules along the Y-pitch (along the X axis) are the metal plus the contact while the critical X-pitch design rules (along the Y axis) are poly pitch limited. The symmetrical virtual ground approach shown in the plan view of the structure of FIG. 4 requires a complex write cycle which needs a lot of peripheral overhead circuitry. Overall, therefore, the reduced cell size taken together with the peripheral complexity yields no substantial improvement in the die size.

The asymmetrical virtual ground structure of the type used by Wafer Scale Integration (see FIGS. 5a and 5b and the '893 patent), the assignee of this application, has in the Y-pitch (along the X axis) metal plus one-half a contact and has in the X-pitch (along the Y axis) a diffusion pitch limitation. As shown in FIGS. 5a and 5b, the cell is asymmetrical. This yields a very simple peripheral circuit and thus yields the smallest die size with the least aggressive design rules and the simplest peripheral circuitry. For the same 0.8 micron technology, this cell size will be about 4.5 microns square.

Therefore the architectural improvement which reduces cell size to the minimum feature cell size is the preferred approach to take in reducing the size (i.e., "scaling") EPROMS.

SUMMARY OF THE INVENTION

In the prior art, using the asymmetrical cell, a control transistor or transfer transistor was used together with each floating gate transistor. The presence of a control transistor adjacent to each floating gate transistor consumed silicon space. Accordingly, the removal of the transfer transistor from each split gate structure would result in substantial area savings. In accordance with this invention the transfer transistor is removed from each split gate transistor and moved to a separate portion of the wafer. Moreover, a plurality of transfer transistors are combined into one transfer transistor which will then control the current to any one of a plurality of floating gate transistors. Typically, one transfer transistor will be used in accordance with this invention to control the current to, for example, each of 64 floating gate transistors, although other numbers of floating gate transistors can be used with one transfer transistor depending on design considerations.

The removal of the transfer transistor from the asymmetrical transistor in a prior art EPROM would not have gained any space because the minimum dimension was controlled by the metal pitch. The metal pitch was so much larger than the minimum transistor dimensions that it did not matter whether or not the transfer transistor was included with each floating gate transistor. The removal of the transfer transistor would not have gained any area savings because the metal pitch was the limiting factor.

In accordance with this invention by eliminating every other metal line and using a virtual ground, the metal pitch is no longer the controlling dimension. Substantial savings in area are gained by removing the transfer transistor from each split gate transistor and combining a plurality of the removed transfer transistors into one transfer transistor and placing this one transfer transistor on a different portion of the silicon. Despite the removal of each transfer transistor from directly adjacent to each floating gate transistor and the combining of a plurality of transfer transistors into one or two remote transfer transistor the basic asymmetry of each floating gate memory cell is retained.

Further, in accordance with this invention the transfer transistor is now fabricated using self-aligned techniques whereas in the prior art and particularly in the Eitan '893 patent the transfer transistor was not self-aligned. aligned. The self-aligning of the transfer transistor insures more predictable performance across the array because the characteristics of the transfer transistor are not dependent upon manufacturing tolerances to the same extent as in the prior art and thus the performance of each of these transistors is more predictable.

In accordance with this invention, the cell dimensions are now reduced to the theoretical limits of the photolithoqraphy rather than, as in the prior art, by design considerations. Thus in a 0.8 micron technology (i.e. the minimum design feature size is 0.8 microns) the minimum cell size will be 1.6 micron on a side or have a minimum cell area of 2.56 microns squared. On the other hand for a 0.6 micron minimum design rule the minimum cell size will be 1.44 microns. On a 0.5 micron technology the minimum cell size will be one micron squared.

In accordance with this invention a shared metal virtual ground array is provided which allows the size of each EPROM cell to be reduced substantially relative to the size of the prior art cell for the same design rules.

Furthermore, although each floating gate transistor in the array is arranged between two parallel, doped source and drain regions, such that a plurality of elongated, parallel, doped regions are formed in the substrate of the array with a number of floating gate transistors arranged in line between each pair of doped source and drain regions, metal contacts are made only to every other elongated doped region thereby to greatly reduce the space taken by the conductive metal lines and their contacts to the underlying doped regions. The cell pitch is now limited by the minimum theoretical pitch between parallel doped source and drain regions.

In accordance with this invention although one control transistor would be adequate for controlling the current to a plurality of transistors, in fact two parallel control transistors are used for this purpose thereby reducing substantially the resistance seen by the current passing through a given floating gate transistor.

Central to the structure of this invention is the use of the segmented bit line. The segmented bit line allows the reduction of the number of metal lines by one-half and thereby removes the metal line pitch as the controlling dimension on the cell size in the array. The segmented bit line together with two control lines achieves the asymmetry required in the cell to reduce the peripheral overhead while at the same time eliminates the metal line pitch as the controlling factor in minimum cell size.

In addition, the architecture of this invention allows a substantial reduction in the number of contacts compared to the prior art contacts for the same array size. For example, in a 16 megabit array using the prior art technology of FIG. 3, there will be 8,388,608 contacts to the bit lines. However, the prior art asymmetrical split gate 16 megabit EPROM manufactured by WSI (shown in cross section in FIGS. 5a and 5b), the assignee of this invention, would have 524,288 contacts to the bit lines. The same size EPROM array in accordance with this invention will have only 131,072 contacts to the bit lines. The reduction in the number of contacts is a material factor in reducing the minimum cell size and therefore the total die size for the array. This number of contacts (131,072) is currently the number of contacts which the industry has on a 256K EPROM. Thus the invention allows an EPROM array 64 times larger than the industry standard 256K EPROM with the same number of contacts.

This invention will be more fully understood in conjunction with the following detailed description taken together with the attached drawings.

DETAILED DESCRIPTION

While one embodiment of this invention will be described in detail, those skilled in the art will recognize, in view of the description, that the invention can take other forms and shapes. Thus the following description is illustrative only and not limiting.

Figure 6:
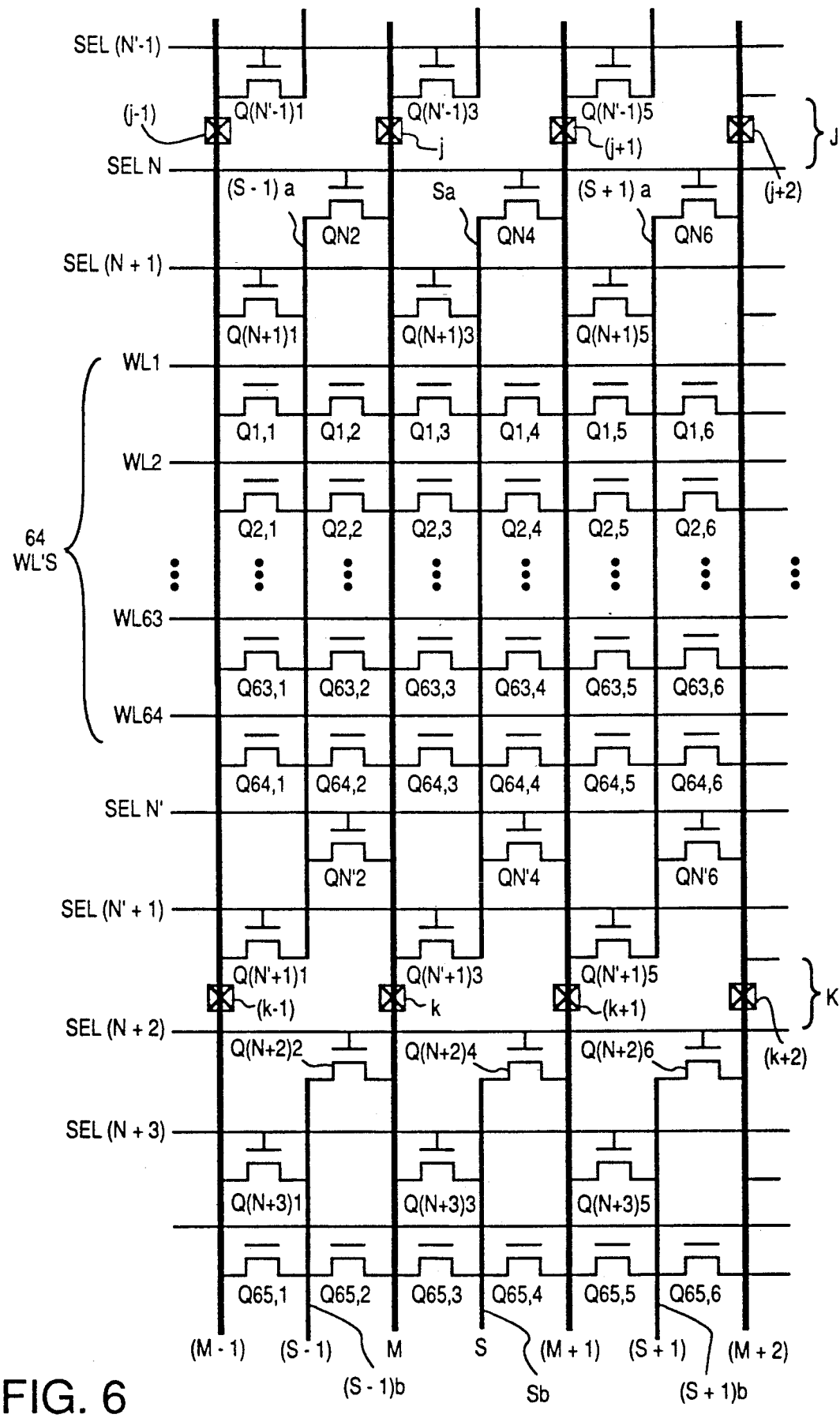
FIG. 6 illustrates schematically the arrangement of the floating gate transistors and the select transistors in an array constructed in accordance with the principles of this invention.

FIG. 6 shows schematically a portion of an EPROM array in accordance with the principles of this invention. Only a small portion of an EPROM array is shown in FIG. 6. Typically, the portion shown in FIG. 6 is part of a much larger array such as a one megabit, four megabit, or 16 megabit EPROM array. For example, a 16 megabit array arranged in a square configuration would have 4,096 memory cells on a side for a total of 16,777,216 memory cells. The structure shown in FIG. 6 is but a small part of such an array constructed in accordance with this invention.

As shown in FIG. 6, a plurality of floating gate transistors $Q1,1$ through $Q64,6$ and $Q65,1$ through $Q65,6$ are shown. For convenience, each floating gate transistor is denoted by the symbol Q followed by a number denoting the row r and a second number denoting the column c. Thus a typical array would contain RC floating gate transistors where R is the total number of rows of floating gate transistors in the array and C is the total number of columns of floating gate transistors in the array. Thus a given transistor $Qr,c$ represents any selected one of the RC floating gate transistors in the array where r is an integer given by $1 \leq r \leq R$ and c is an integer given by $1 \leq c \leq C$.

A typical floating gate transistor $Qr,c$ consists of a source and a drain region separated by a channel with a floating gate overlying but insulated from the channel. Typically the floating gate is formed from a first layer of polycrystalline silicon denoted as "poly 1" in a manner to be described later. Overlying the floating gate is additional insulation, typically silicon dioxide but sometimes a sandwich of silicon dioxide and silicon nitride, and a control gate typically formed from a second layer of polycrystalline silicon denoted "poly 2." The control gate is also called a "word line."

Associated with each floating gate transistor shown in FIG. 6 is a select transistor such as transistors QN2, QN4, QN6, Q(N+1)1, Q(N+1)3 and Q(N+1)5 for example. The select transistors shown in FIG. 6 serve the same function as the poly 2 transistor in a typical split gate EPROM of the type described for example in the above mentioned U.S. Pat. No. 4,639,893. U.S. Pat. No. 4,639,893 is hereby incorporated by reference in its entirety.

The select transistors such as QN2 through Q(N+1)5 are connected to select lines SELN and SEL(N+1) as shown.

Each floating gate transistor $Qr,c$ is formed on the semiconductor substrate between a pair of bit lines. For example, bit lines M−1, S−1, M, S, M+1, S+1, M+2 are shown running vertically in FIG. 6. Transistor Q1,2 for example is formed between bit lines S−1 and M. Thus transistor Q1,2 has its drain connected to bit line M and its source connected to bit line S−1. Floating gate transistors Q2,2 through Q64,2 are similarly formed between bit lines S−1 and M. In addition floating gate transistors Q65,2 through Q128, 2 (not shown) are formed between bit lines S−1 and M. For reasons to be explained later, every other bit line is segmented. Thus in FIG. 6, bit lines S−1, S and S+1 are segmented into lengths each sufficiently long to form the drain or source region for sixty four (64) floating gate transistors Qr,c and also to be electrically connected to selected ones of the control transistors such as QN2, Q(N+1)1, QN'2 and Q(N'+1)1. Bit lines M−1, M, M+1 and M+2 are however not segmented, for reasons to be explained later. Thus as an important feature of this invention, each control transistor (also called from time-to-time herein a "select" or "pass" transistor) previously directly adjacent a corresponding floating gate transistor in the prior art has been removed to a separate location in the EPROM array physically spaced apart from the corresponding floating gate transistor with which it was physically in series. A number of the removed select transistors are replaced with only two select transistors on two separate portions of the die. Thus, for example, select transistors QN2 and Q(N+1)1 have been placed as shown in FIG. 6 between source region (S−1) and drain region M and between drain region (M−1) and source region (S−1), respectively, at the top of the section of the EPROM array containing floating gate transistors Q1,1 through Q64,1 and Q1,2 through Q64,2. One select transistor in accordance with this invention is thus capable of being used to control sixty four (64) floating gate transistors resulting in a very substantial reduction in the size of each memory cell. However, as shown in FIG. 6, in fact two select transistors rather than just one select transistor are actually used in accordance with this invention to control sixty four (64) floating gate transistors. As shown in FIG. 6, select transistors Q(N+1)1 and Q(N'+1)1 are connected between metal bit line M−1 (which functions as a drain) and segment (S−1)a of bit line (S−1) while select transistors QN2 and QN'2 are connected in parallel between metal bit line M which functions as a drain and segment (S−1)a of bit line (S−1) which functions as a source. Select transistors Q(N+1)1 and Q(N'+1)1 function as a pair of parallel-connected select transistors in series with any selected one of floating gate transistors Q1,2 through Q64,2. Parallel-connected select transistors QN2 and QN'2 are connected in series with a selected one of floating gate transistors Q1,1 through Q64,1. As will be shown below, the parallel connection of two select transistors actually reduces the resistance to current flow offered by the circuits containing the select transistors to one-quarter the amount which would be present with just one select transistor.

The bit lines (M−1), (S−1), M, S, (M+1), (S+1) et al. are typically formed by implanting an impurity in vertical elongated strips in the semiconductor substrate to form the conductive source and/or drain regions. In accordance with this invention, the metal bit lines M−1, M, M+1 and M+2 will always be drains while the bit lines S−1, S and S+1 will always be sources.

The metal bit lines M−1, M, M+1 and M+2 basically consist of metal conductive strips formed on insulation over the word lines WL1, WL2, ... WL64, for example, which are formed from the second layer of polycrystalline silicon. The metal conductive strips contact the underlying elongated diffused bit lines at every Nth cell by means of contacts such as contacts (j'11), j, (j+1) and (j+2) or contacts (k−1), k, (k+1) and (k+2) for example, where N is a selected integer (typically 8, 16, 32 or 64) selected taking into account the acceptable resistive voltage drop associated with the diffused bit lines (S−1), S and (S+1), for example. By placing the metal strips M−1, M, M+1 and M+2 in parallel with the underlying diffused bit lines, the total resistance of the bit lines is significantly lowered allowing the fabrication of large one megabit, four megabit or 16 megabit memory arrays.

In reading the contents of a given floating gate transistor Qr,c the operation of the circuit is similar to that while programming except that the voltage on the drain bit line (such as line (M−1), M, (M+1) or (M+2)) and the word line such as line WL1, WL2, ... or WL64) are maintained lower than while programming. For example, to read transistor Q1,2 metal bit line M is raised to a high voltage thereby raising the drain of transistor Q1,2 to a high voltage. Segment (S−1)a of bit line (S−1) is connected through select or control transistors Q(N+1)1 and Q(N'+1)1 to metal bit line (M−1). Metal bit line (M−1) is held at ground potential. A high voltage is applied to SEL(N+1) and SEL(N'+1) by the logic on the chip thereby applying a high gate voltage to and thus turning on select transistors Q(N+1)1 and Q(N'+1)1. Consequently, source bit line segment (S−1)a is held at the same low voltage as metal bit line (M−1). A selected high voltage is then applied to word line WL1. Other word lines WL2 through WLR (where R is an integer representing the maximum number of rows) are held at low voltages. Because the drain of transistor Q1,2 is at a high voltage, current will flow through transistor Q1,2 if its floating gate stores no electrons thereby allowing the high voltage on the word line (i.e., gate) of floating gate transistor Q1,2 to turn on transistor Q1,2. However, if the floating gate of transistor Q1,2 has been charged with a negative charge, the normal voltage applied to word line WL1 is not sufficient to turn on floating gate transistor Q1,2 and thus no current flow is detected at the sense amps (of well known design and thus not shown) connected to the metal bit lines (M−1) and M.

While reading transistor Q1,2, transistor Q1,3 is not read because the potentials on its drain (connected to bit line M) and its source (connected to segment Sa of bit line S) are both relatively high because select transistors Q(N+1)3 and Q(N'+1)3 are both turned on by the signals applied to SEL(N+1) and to SEL(N'+1) and pass the high voltage on bit line M to bit line segment Sa. Transistor Q1,4, however, which has its source connected to segment Sa of bit line S will not be read because transistor Q1,4 has its drain connected to metal bit line (M+1) and bit line (M+1) (and all the other bit lines except (M−1) are held at or close to the same potential as bit line M.

To program floating gate transistor Q1,2, metal bit line M is brought to a high voltage. The SEL(N+1) select line and the SEL(N'+1) select lines are also brought to a high voltage by the select logic in the periphery of the device (such select logic is well known in the art and thus will not be shown or described) thereby turning on select transistors Q(N+1)1 and Q(N'+1)1 (also called "control transistors") Metal bit line M−1 is brought to a low voltage. Accordingly, segment (S−1)a of bit line S−1, which functions as a source for all floating gate transistors Q1,1 to Q64,1 and Q1,2 to Q64,2 connected to it, is at a low potential while the drain of floating gate transistor Q1,2, which is connected to bit line M, is at high potential. Consequently, electrons will flow from the source S−1 to the drain M when a positive voltage of sufficient amplitude is applied to word line WL1. These electrons will gain energy from the lateral field in the channel, and some of them will have sufficient energy to pass through the oxide potential barrier and be collected on the floating gate. These electrons are charging or programming the floating gate to store a binary zero (one) depending on the logic convention employed. When the EPROM cell is not programmed (No charge on the floating gate.) it corresponds to a binary one (zero). Thus each transistor stores one bit of information.

For the effective programming of transistor Q(1,2) by hot electron injection, it has to have high voltage on the drain and wordline and a low voltage on the source.

In order for this array architecture to work, no other cell should be programmed, while programming cell Q(1,2). Since high wordline voltage is necessary for programming, the only other cells that can possibly be programmed are located under word-line WL1. In programming, all bit-lines other than M are held to ground by a very weak pull-down. Since high drain voltage is also required for programming, only cells close enough to bit line M can be programmed. In summary, cells Q1,1, Q1,3 and Q1,4 are the only potential candidates to have spurious programming. In the case of cell Q(1,1), during programming, the voltage on metal bit line (M−1) is low while the voltage on bit line segment (S−1)a is also low as a result of select transistors Q(N+1)1 and Q(N'+1)1 being turned on. Accordingly, floating gate transistor Q1,1 is not programmed.

The drain of floating gate transistor Q1,3 will also be at a high voltage because this drain is also connected to metal bit line M. The source of floating gate transistor Q1,3 is, however, connected to segment Sa of bit line S. Segment Sa of bit line S is connected by pass transistors Q(N+1)3 and Q(N'+1)3 to metal bit line M which is at a high voltage level. Consequently, bit line segment Sa, which comprises the source of transistors Q1,3 through Q64,3 and transistors Q1,4 through Q64,4 is also at a relatively high voltage. Consequently the source of transistor Q1,3 is high and the requirement for low source voltage is not fulfilled hence Q1,3 will not program even though the symmetrically placed transistor Q1,2 will program. Note that floating gate transistors Q2,3 through Q64,3 will not program in any event because the word lines WL2 through WL64 are held at a low voltage level thereby keeping transistors Q2,3 through Q64,3 turned off while word line WL1 is raised to a high voltage level.

Transistor Q1,4 has its source connected to bit line segment Sa of bit line S and its drain connected to bit line (M+1). Bit line (M+1) is held at ground by the weak pull-down. However, bit line segment Sa is held at a relatively high voltage by means of transistors Q(N+1)3 and Q(N'+1)3 being turned on thereby allowing part of the high voltage on metal bit line M to be transmitted to segment Sa of bit line S. This configuration of bit line M high and split gate transistor (the combination of select transistors Q(N+1)3 and Q(N'+1)3 and floating gate transistor Q(1,4)) in the reverse mode is very inefficient in programming. It is ten orders of magnitude smaller than the programming of the same transistor with the drain held high and the source low. Accordingly, transistor Q1,4 will not program in the time it takes to program floating gate transistor Q1,2. Of course, metal bit line (M+1) is held weakly to ground so in the worst case it is zero volts but in reality due to the current flowing through Q(1,4) and select transistor Q(N+1)3 and Q(N'+1)3 it will be pulled up to 2, 3 or 4 volts thereby reducing even further the likelihood that transistor Q1,4 will program. Moreover, the segment Sa of source bit line S will probably be at about 6 or 7 volts in the reverse direction and thus transistor Q1,4 will not program because VDS (the voltage between the drain and the source of transistor Q1,4) is too small. The reverse programming was discussed in great length in U.S. Pat. No. 4,639,893.

For efficient programming bit-line M has to be pulled up to high voltage through the bit-line decoder.

The only case in which the supply of the high voltage becomes a problem is when the current from bit-line M to M−1 becomes too high. Supplying the programming current through transistor Q(1,2) while maintaining the high bit-line voltage is guaranteed by design.

However, in case of excessive leakage through the other transistors on bit line M a problem may arise. The excessive leakage can occur through the drain turn on of floating gate transistors other than Q(1,2) next to bit line M. Even when these transistors are only slightly turned on to conduct only say 1 µA per cell on a 16M array, where there are 4,096 cells associated with each bit-line, the total leakage will amount to 4 mA which will cause a programming speed problem.

By using the concept of segmenting bit-lines, S,S+1 etc. only the selected segment Sa may have the turn on problem, since, Sa is the only segment that has a connection from bit line M to bit line M−1 through the select transistors. As a result, the maximum leakage current from the unselected transistors in the above example will amount to 64 µA rather than 4 mA in the unsegmented case. This small addition to the 0.5 mA programming current is of no concern.

The creation of segments such as segments Sa and Sb of soruce bit line S and segments (S−1)a and (S−1)b of source bit line (S−1) is an important feature of the invention. The word lines WL traverse or travel over only the floating gate transistors and not over the select or control transistors as in the prior art. (See for example U.S. Pat. No. 4,639,893 for a word line extending over both the floating gate and select transistors). The select lines SELN, SEL(N+1), SELN' and SEL(N'+1) are the complementary word lines that select the particular transfer (i.e., floating gate) device to be read or programmed.

As is apparent from the above description, when SEL(N+1) is activated with a high level signal, the peripheral logic is such that SEL(N'+1) is also activated with the same signal. Thus, for example, two select transistors Q(N+1)1 and Q(N'+1)1 connected to segment (S−1)a on bit line S−1 are turned on. These two transistors are in parallel and thus reduce to one-fourth the resistance seen by the current which either reads or charges the floating gate associated with, for example, the particular floating gate transistor Qr,2 connected to segment (S−1)a and controlled by the two parallel-connected select transistors Q(N+1)1 and Q(N'+1)1.

The maximum resistance in the case of one select transistor is the full resistance of segment (S−1)a. The maximum resistance with two parallel transistors is half of the resistance of segment (S−1)a connected from two sides in parallel. Two equal parallel resistors have a total resistance equal to half of each, or, quarter of the sum of their resistance. The sum is just the total segment resistance in the case where the segment is connected in one end only.

Figure 1:
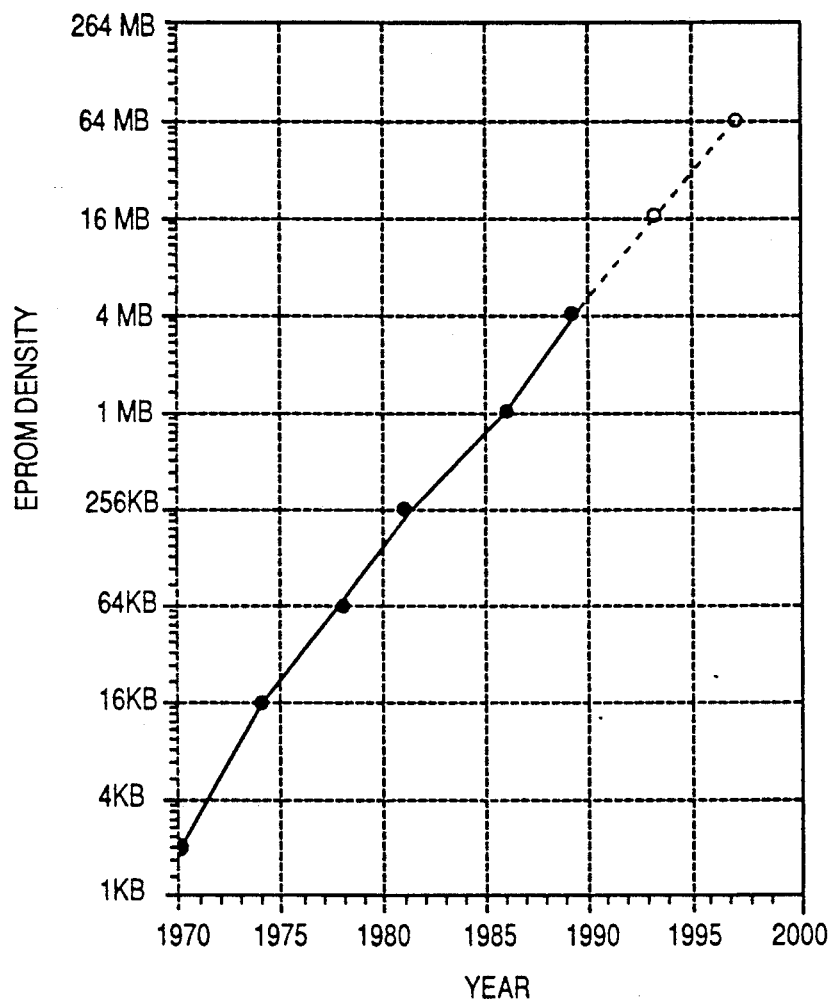
FIG. 1 is a plot of EPROM density versus time showing density doubling approximately every 1.8 years.
Figure 2:
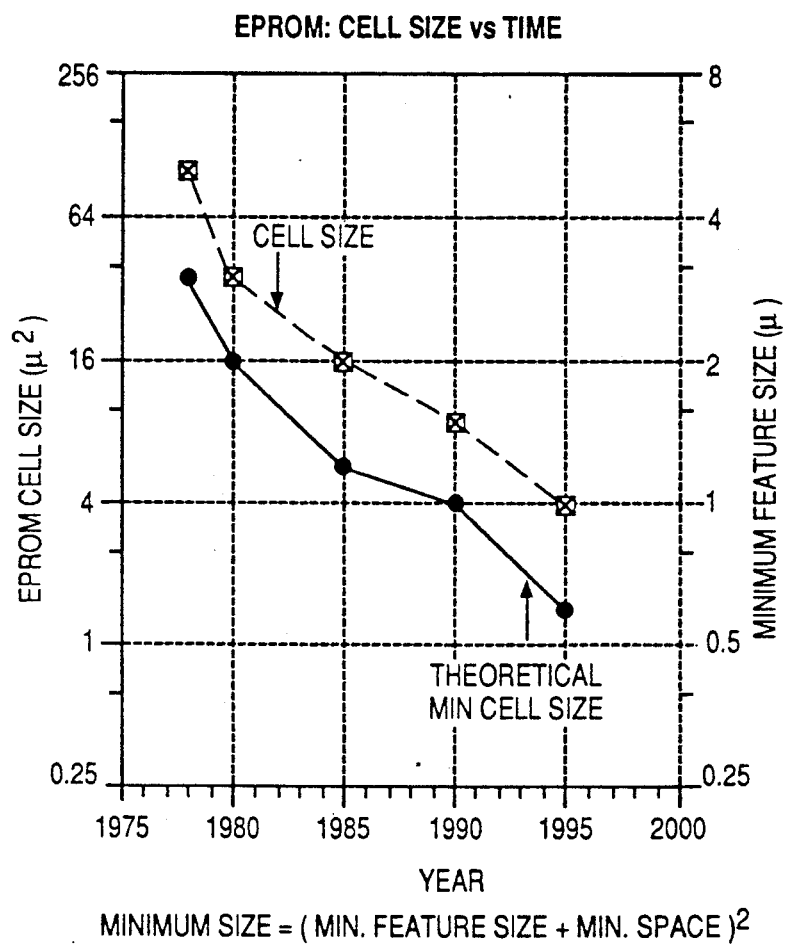
FIG. 2 is a plot of EPROM cell size versus time showing cell size halving about every 3.5 years.
Figure 3:
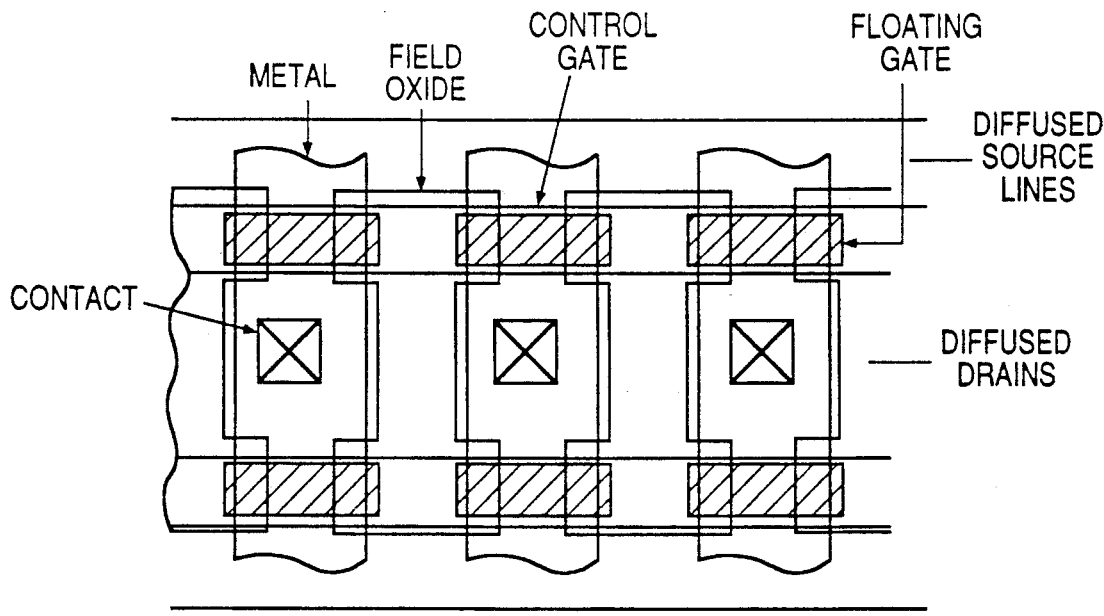
FIG. 3 shows a standard EPROM cell layout with the diffused drains being shared by two adjacent floating gate transistors and contacts required to each diffused drain.
Figure 4:
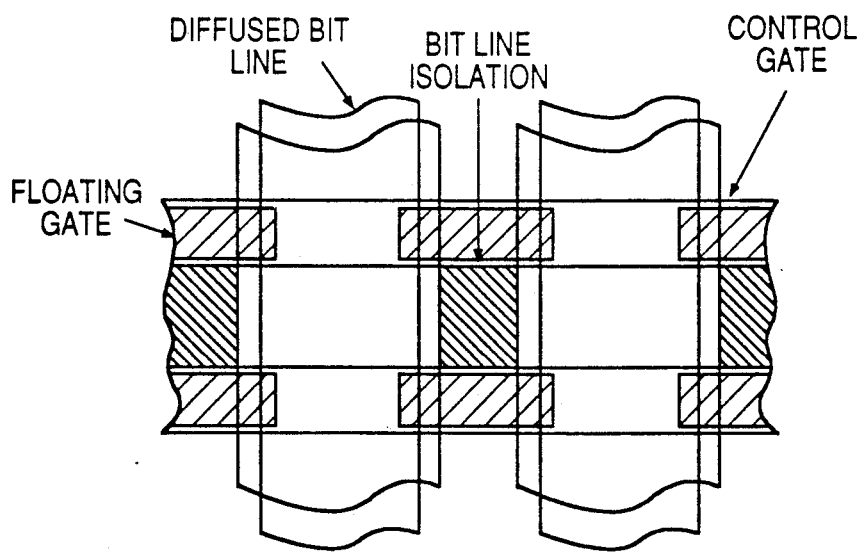
FIG. 4 shows a standard EPROM layout of a symmetrical cell using a virtual ground.
Figure 5A:
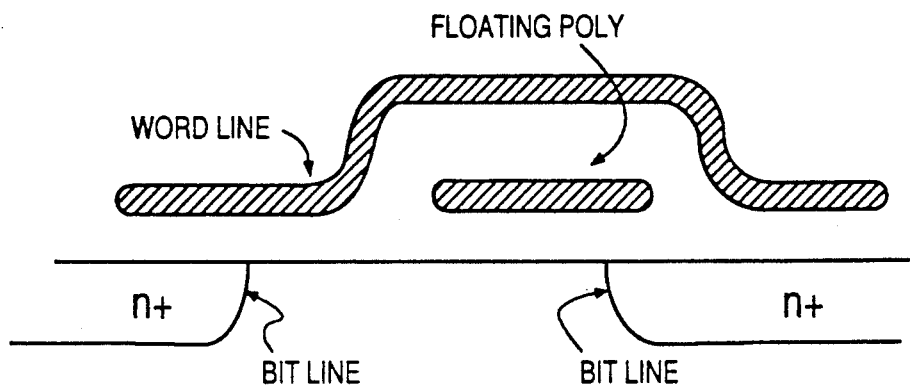
FIGS. 5a and 5b illustrate schematically and in cross-section the asymmetric floating gate transistor of wafer scale described in the Eitan's '893 patent.
Figure 5B:
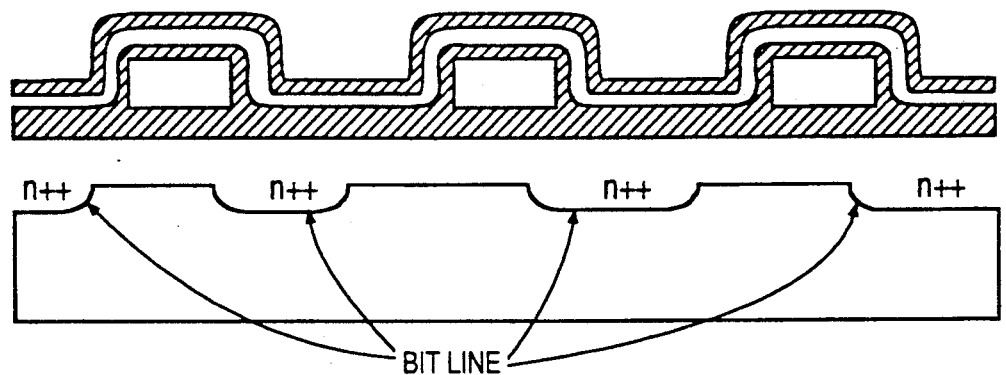

The contacts (j−1), j, (j+1), (j+2), (k'11), k, (k+1) and (k+2) for example, between the metal layers (M−1), M, (M+1) and (M+2) formed over the underlying elongated, diffused (actually ion-implanted) drain regions, in accordance with this invention are placed every N transistors along a column of the array, where N is a selected integer such as 8, 16, 32, 64 or 128. As shown in FIG. 6, the array in one embodiment is divided into 64 rows of floating gate transistors Qr,c (i.e. N=64). A word line WL is associated with each row r of floating gate transistors Qr1 through QrC. Four select lines SELN, SEL(N+1), SELN' and SEL(N'+1) are associated with each group of 64 rows of floating gate transistors. The area of the array between adjacent groups of floating gate transistors, such as between row 64 and row 65 of floating gate transistors, includes a space K in which contacts (k−1), k, (k+1) and (k+2) are made by means of vias through the underlying insulation from the metal lines (M−1), M, (M+1) and (M+2) to the underlying elongated drain regions. The contacts are allowed to have a greater dimension than the widths of the metal bit lines (M−1), M, (M+1) and (M+2) because the metal bit lines actually are spaced every other bit line apart rather than every bit line. Therefore the area of each contact (j−1) ... (j+2) ... (k−1) ... (k+2) can be much wider than the underlying width of the diffused source ((S−1), S, (S+1)) and drain ((M−1), M, (M+1)) bit lines without any significant impact on the pitch of the metal bit lines (M−1), M, (M+1). The actual spacing of contacts K from contacts J (at the top of the array of FIG. 1) is dependent upon the bit line resistance desired. Under some circumstances it may be possible to space adjacent rows of contacts such as J and K by 128 rows of floating gate transistors Qr,c rather than the 64 rows of floating gate transistors Qr,c shown in FIG. 6. The only requirement is that the bit line resistance not become too high.

The operation of the unique structure of this invention is the same as the operation described for a standard split gate EPROM wherein the select transistor and the floating gate transistor are integrally formed in series as part of each cell. The operation of such a transistor is described in an article entitled "A 50-ns 256K CMOS Split-Gate EPROM" by Syed B. Ali, et al. published in the IEEE Journal of Solid State Circuits, Vol. 23, No. 1, February 1988, p. 79 to 85. The sensing circuits and the decoding circuits are the same for this invention as in the Ali et al. article. However, the operation of the select lines (SELN, SEL(N+1), SELN' and SEL(N'+1) are different and have been described above in the sections on Read and Programming operations.

PROCESS DESCRIPTION

This description will be of a module (i.e., a discrete set of process steps unique to this invention). The initial steps in the process are standard and thus will not be described nor will the standard steps used to form the contacts and the interconnects on the array following the formation of the cells in the array in accordance with this invention.

First, the entire array is formed on a semiconductor wafer, preferably silicon. Initially the wafer, typically P-type silicon having a resistivity of 20 ohm centimeters, is subjected to a sheet diffusion or implantation of a P-type impurity, typically boron, to adjust the threshold of the to-be-formed MOS transistors. The impurity is implanted over those portions of the top surface of the wafer where there are no n-wells. This is a standard implant through a thin oxide using a boron implantation to form an impurity concentration of boron of about $1 \times 10^{17}$ atoms per cubic centimeter in the top portion of the underlying wafer. Following this implant, the wafer is cleaned using, for example, an etch consisting of a mixture of sulfuric and hydrofluoric acids, hydrogen peroxide Any other appropriate etch can also be used. A gate oxide for the array transistors is then formed on the wafer surface to about 200Å thickness using 1000° C. dry $O_2$ with TCA or HCl. Then a first layer of about 1000Å to 2000Å thick polycrystalline silicon is deposited over the whole wafer promptly following completion of the gate oxide. From this layer, known as "poly 1", the floating gates of the floating gate transistors Qr,c in the array of memory cells are fabricated. The thicknesses of the gate oxide and the polycrystalline silicon layer may vary from the thicknesses given to optimize cell performance. This first polycrystalline silicon layer is doped at about 920° C. using $POCl_3$ to achieve a resistance of about 30 to 50 ohms per square. The wafer is then cleaned, for example, in 10:1 HF for about 60 seconds to deglaze the surface and then cleaned using, for example, sulfuric acid. Other chemicals can be used, if desired, to accomplish this same result.

A sandwich layer of oxide-nitride-oxide for the dielectric between the first layer of polycrystalline silicon and the to-be-formed second layer of polycrystalline silicon is now formed. First, the first layer of polycrystalline silicon is oxidized to a thickness of about 150Å at about 1075° C. If desired, TCA can be used during oxidation to enhance the quality of the resulting oxide. Next silicon nitride is deposited to a thickness of about 150Å and then the silicon nitride is subjected to a wet oxidation to grow approximately 30Å to 50Å of oxide on the nitride. The total dielectric thickness of the oxide-nitride-oxide sandwich is about 350Å, but because the nitride is equivalent to half of the total thickness, the equivalent oxide thickness is about 250Å.

This 250Å euivalent oxide thickness for the dielectric layer gives a higher coupling ratio between the to-be-formed "poly 2" word line (i.e., the control gate) and the underlying poly 1 floating gate than is achieved with a thicker dielectric.

Following the formation of the oxide-nitride-oxide dielectric sandwich, a 500Å layer of polycrystalline silicon is deposited over the sandwich dielectric within the a short time after wet oxidation. This short time is defined as "Q-time" and is selected to minimize oxide degradation due to environmental effects. This very thin 500Å layer caps the entire structure. Following the formation of the 500Å thick polycrystalline silicon cap, a 150Å thick layer of silicon nitride is deposited over the entire structure. This deposition again occurs within Q-time after the polycrystalline silicon deposition. Later on the 500Å thick polycrystalline silicon capping layer will serve as an electrode and a contact to the yet-to-be-formed second layer of polycrystalline silicon which will form the word line of the array and which must be coupled to the floating gate. Thus, this capping layer will serve as a conductor.

Figure 7A:
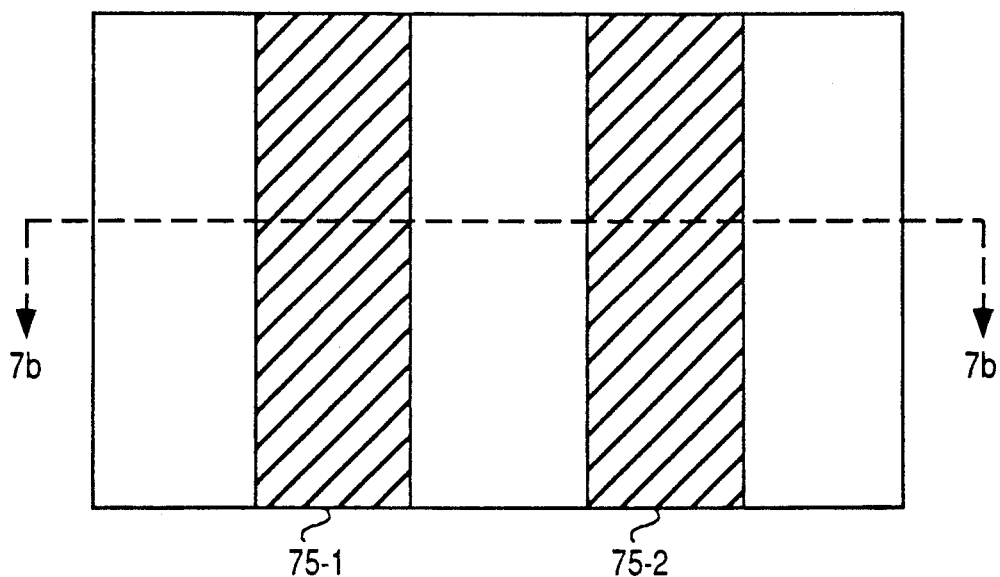
FIGS. 7a through 7k illustrate the process used to fabricate the structure of this invention.
Figure 7B:
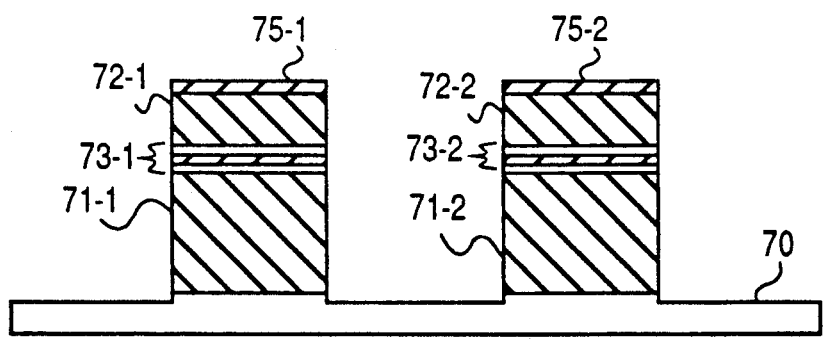

Following the formation of the 150Å nitride over the 500Å polycrystalline silicon cap, photoresist is formed over the structure and patterned. Then the 150Å nitride, the 500Å polycrystalline silicon cap and the oxide-nitride-oxide sandwich and the underlying poly 1 are etched in an isotropic etcher, using, for example, hydrobromic etch chemistry. The structure is inspected to verify no residual polycrystalline silicon ("poly 1") is left in the etched regions on the underlying gate oxide. The resulting structure is shown in top view in FIG. 7a and in cross-section in FIG. 7b. As can be seen, the first layer of polycrystalline silicon (poly 1) has been selectively removed to form on the wafer vertical strips of polycrystalline silicon covered by an oxide-nitride-oxide sandwich on top of which is a cap of polycrystalline silicon to a thickness of about 500Å covered by a 150Å layer of silicon nitride.

The wafer then is stripped of resist using, for example, a 50 to 1 HF dip for 15 seconds and then cleaned using sulfuric acid and hot deionized water. Following the cleaning, the wafer is oxidized at about 1000° C. in dry oxygen to form spacer oxide of 250Å thickness on the sides of the polycrystalline silicon. The resulting structure is shown in top view in FIG. 7c and in cross-sectional view in FIG. 7d. The structure has had spacer oxide 71a and 71b formed on the sides of polycrystalline fingers 71-1 and 71-2 and oxide 72a and 72b formed on the sides of polycrystalline silicon caps 72-1 and 72-2. Following the formation of the spacer oxide on the sides of the fingers such as fingers 71-1 and 71-2 of the first layer of polycrystalline silicon and the sides of polycrystalline silicon caps 72-1 and 72-2, the wafer is covered with photoresist which is patterned to protect the areas in which the select transistors QN2, QN4, QN6, Q(N+1)1, Q(N+1)3, Q(N+1)5, QN'2, QN'4, QN'6, Q(N'+1)1, Q(N'+1)3 and Q(N'+1)5, as well as portions of the contact regions J and K (other than where the bit lines will be formed) in the array from the implantation of impurities to be used to form the bit lines.

Following this patterning, arsenic is implanted at 80 kilovolt intensity to form a dosage of $4 \times 10^{15}$ atoms per square centimeters in the underlying silicon between fingers 71 of the first layer of polycrystalline silicon.

The photoresist, which has blocked bit line implant impurities from the areas where the select transistors are going to be formed, is then removed in a well-known manner. The resulting structure is as shown in plan view in FIG. 7c and in cross-sectional view in FIG. 7d. Next a photoresist mask is placed on the wafer to define the islands of poly 1 to be left on the wafer to form the floating gates of the to-be-formed floating gate transistors. The wafer is then etched using a hydrochloric-hydrobromic acid. Following the etching the wafer is inspected to verify no residual polycrystalline silicon is left on the wafer and then the field impurity is implanted over the array to adjust the field threshold of the areas between the floating gate islands. The implantation uses boron[11] with an energy of 45 kev for a dose of $4.0 \times 10^{13}$ atoms per square centimeter. This dose forms a channel stop in the P-type semiconductor substrate to prevent leakage currents between devices across the field of the device.

The photoresist is now stripped from the wafer in a well-known manner.

Next the wafer is oxidized in 1000° C. dry $O_2$ to grow approximately 1000Å of oxide over the field of the device and to form additional oxide 71c, 71d over the sides of the first layer of polycrystalline silicon material 71-r,1 and 71-(r+1),1 and oxide 72c, 72d over the sides of the capping polycrystalline silicon 72-r,1 and 72-(r+1),1 left after the previous etch step which etched not only the first layer of polycrystalline silicon 71 but the dielectric sandwich 73 and the overlying 500Å thick capping polycrystalline silicon 72.

Figure 7C:
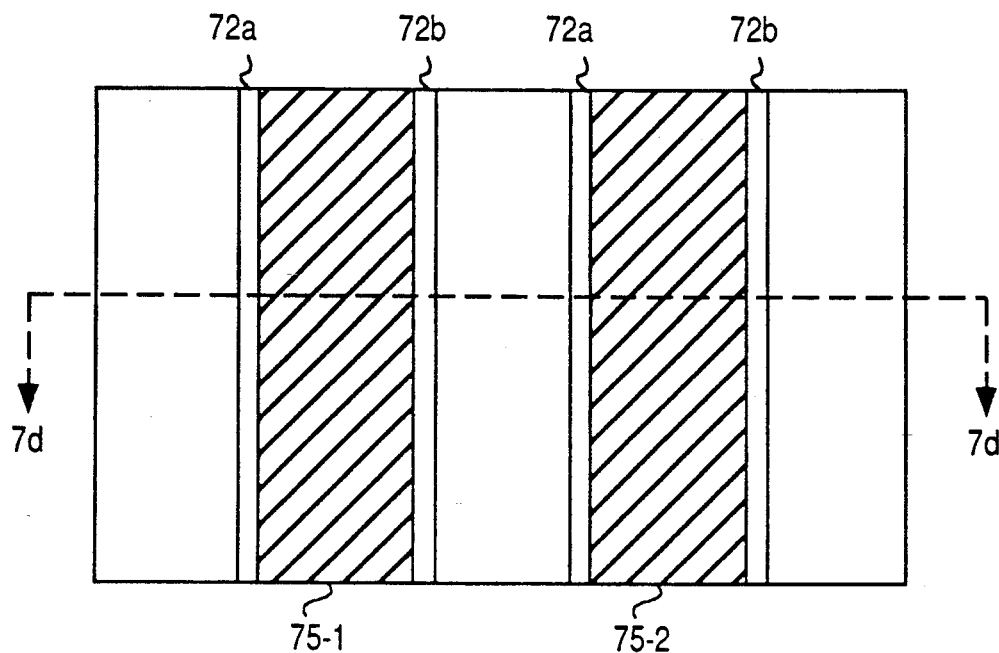
Figure 7D:
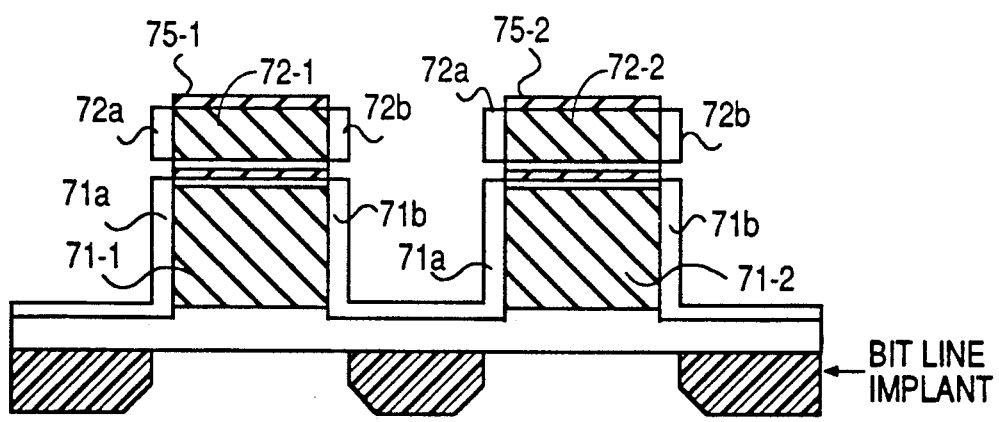
Figure 7E:
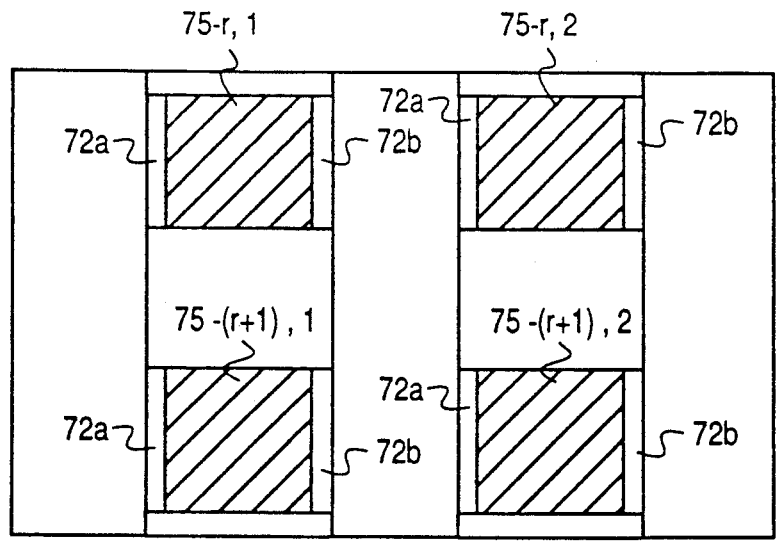
Figure 7F:
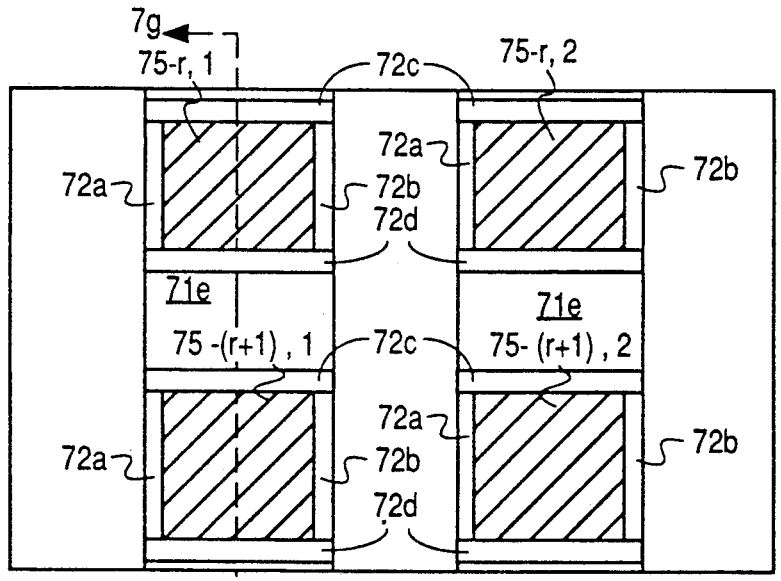
Figure 7G:
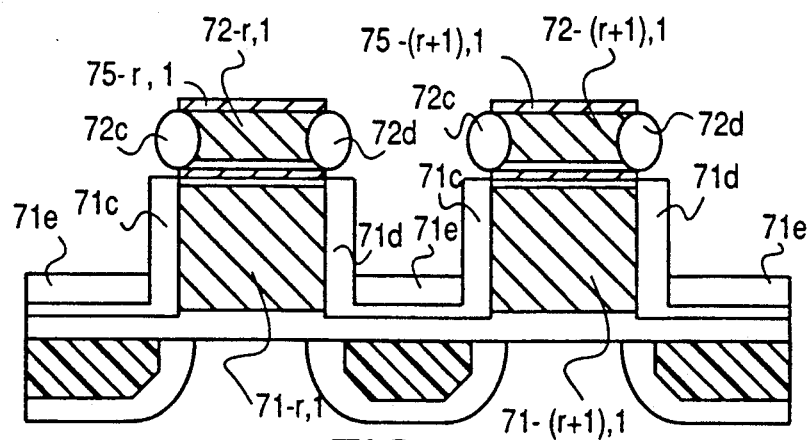

The resulting structure is shown in FIG. 7e, 7f and 7g. In 7g the isolation oxide 71e is formed over the field of the device and particularly over the boron implant region to assist in isolating one transistor from another. The oxidation process results in thick sidewall oxide 71c and 71d forming on polycrystalline silicon islands 71-r,1 and 71-(r+1),1 which will become floating gates of two of the floating gate transistors to be formed in the array. Likewise thick side oxide 72c and 72d is formed on the sides of the capping polycrystalline silicon 72-r,1 and 72-(r+1),1.

This side oxide extends over the implanted field impurity and assists in isolating each floating gate from the other devices.

Of importance, the spacer oxide 71a, 71b shown in FIGS. 7c and 7d insures that the implantation of the diffused bit lines between polycrystalline silicon fingers 71 will not be directly adjacent to the polycrystalline silicon but will be somewhat spaced from this polycrystalline silicon so that subsequent thermal processing which results in lateral diffusion will bring the bit line diffusion just under the polycrystalline silicon material making up the polycrystalline silicon fingers such as fingers 71-1 and 71-2.

The spacer oxide 71a, 71b also assists in minimizing the lateral diffusion of the bit lines beneath the floating gates 71 and thus insures that there is sufficient channel length left underneath each floating gate 71-i to be able to control punch-through. To avoid punch-through, the channel length must not fall below about 0.3 microns because should it do so punch-through of the source region to the drain region is a distinct possibility. Thus, beginning with the definition of the width of the Poly 1 material, which is made to be about 0.8 to 0.9 microns, upon completion of the process steps used to fabricate the array transistors, each polycrystalline silicon floating gate (poly 1) such as gates 71-r,1 and 71-(r+1),1 will be very short. Thus the spacer oxide 71a, 71b is essential to help prevent punch-through which would destroy the transistor. Furthermore, the spacer oxide 71a, 71b helps to minimize the overlap between the bit line and the floating gate 71 even though there must be some overlap in order to have a functioning device.

During the oxidation of the field regions and the sides of poly 1 to form oxide spacers 71c, 71d, the nitride 75 overlying polycrystalline silicon 72 protects this polycrystalline silicon from thermal oxidation.

Note that the field oxidation in the array is *only* in the array. The field oxidation in the peripheral area is done before the field oxide in the array is generated.

Note that during the oxidation of the field of the wafer, oxidation also occurs over the bit line. However, this is acceptable because later on when the word line is to be deposited from the second layer of polycrystalline silicon ("poly 2"), the word line to bit line capacitance will be quite low because of this thick field oxide over the bit line. This will become apparent in the description of the relationship of the word line to the bit line in conjunction with FIG. 7i below. The field oxidation over the bit line results in a thicker oxide than over the regions of the wafer without an impurity implant because the rate of oxidation of silicon is faster over heavily doped silicon material than it is over lightly doped or undoped silicon material.

Next a mask is placed over all of the transistors in the memory array and the oxide over the periphery of the device is stripped using, for example, a room temperature etch consisting of 50:1 BOE to remove 1800Å of peripheral oxide.

Following the removal of the peripheral oxide, the photoresist is stripped from the wafer.

The wafer is cleaned using a standard cleaning solution and then the wafer is oxidized at about 920° C. in dry $O_2$ to form the gate oxide of the peripheral devices and of the select transistors. This oxide is formed to a 200Å thickness.

Next photoresist is formed over the periphery.

Following the formation of the peripheral mask. nitride 75 overlying the polycrystalline silicon caps 74 is removed first using. for example, a 13:2 BOE at room temperature to remove any native surface oxide on nitride 75 and then the nitride itself is removed using a 165° C. phosphoric acid etch (H$_3$PO$_4$). The wafer is then stripped of photoresist in a standard manner.

Next, a second layer of polycrystalline silicon ("Poly 2") is deposited on the wafer. First the wafer is cleaned using the standard and then polycrystalline silicon is deposited to about a 250Å thickness.

The floating gates such as floating gate 71-r,1 and 71-(r+1),1 as shown in FIG. 7g are totally sealed on all sides with high quality oxide which is independent of any other process actually carried out or to be carried out in the periphery of the device. In particular, the floating gates have been totally sealed prior to the formation of the word line silicide. This is advantageous because silicide is a difficult material to maintain intact while oxidizing at high temperature. By oxidizing the sides of the floating gates such as floating gate 71-r,1 at temperatures under 1000° C. the amount of lateral diffusion of the dopant in the bit lines is minimized.

During the removal of the nitride layer 75 from the top of polycrystalline silicon 72, resist was present over the periphery of the device so that any nitride on the periphery of the device is not removed.

The second layer of polycrystalline silicon is then doped using POCl$_3$ at 850° C. within Q-time after poly 2 deposition. The resulting dopant is sufficient to yield approximately 55 ohms per square resistance. Following doping of the second polycrystalline silicon layer the wafer is deglazed in 10 to 1 HF for about 60 seconds, and then is cleaned in sulfuric acid for 10 minutes.

Figure 7H:
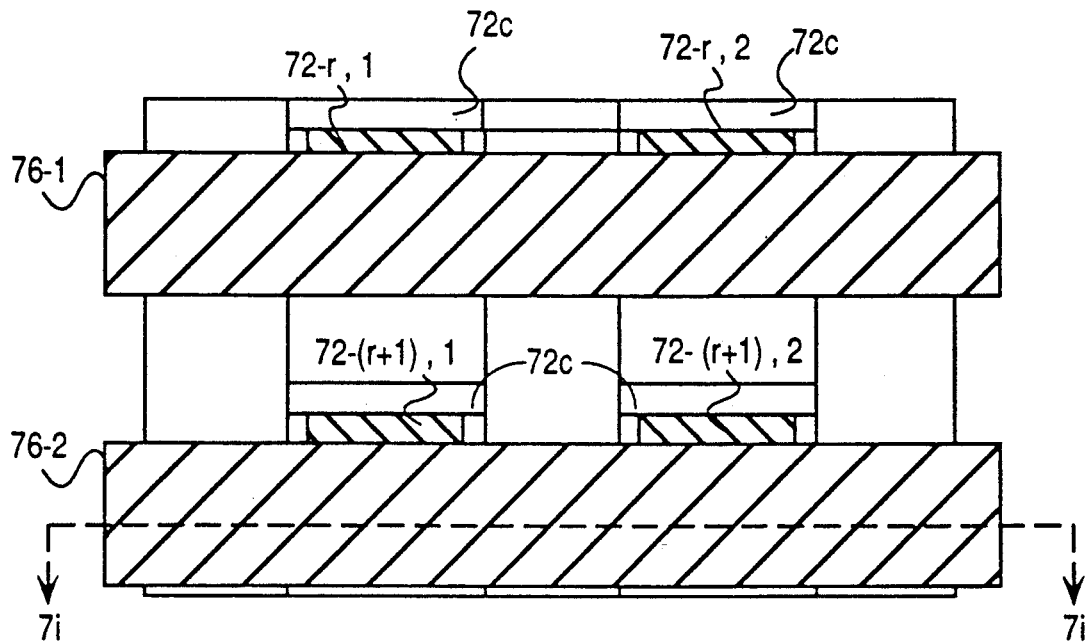

Following the cleaning, the wafer is dipped in 10 to 1 HF to preclean the wafer in preparation for the deposition of the silicide. Following the preclean, tungsten silicide is deposited on the wafer to about 2500Å thickness with a resistance of about 33 ohms per square. Next the wafer is masked and patterned and etched to remove portions of the polycrystalline silicon thereby to form a structure as shown in FIG. 7h. The polycrystalline silicon, tungsten-silicide sandwich is formed into horizontal strips such as strips 76-1 and 76-2 by means of a standard etch such as a mixture of hydrochloric and hydrobromic acid. The remaining oxide in the periphery of the device will be greater than 100Å thick. An etch inspection is then conducted to verify that no unwanted residual silicide remains on the wafer.

The photoresist is then stripped from the wafer with a 50 to 1 HF dip.

Figure 7I:
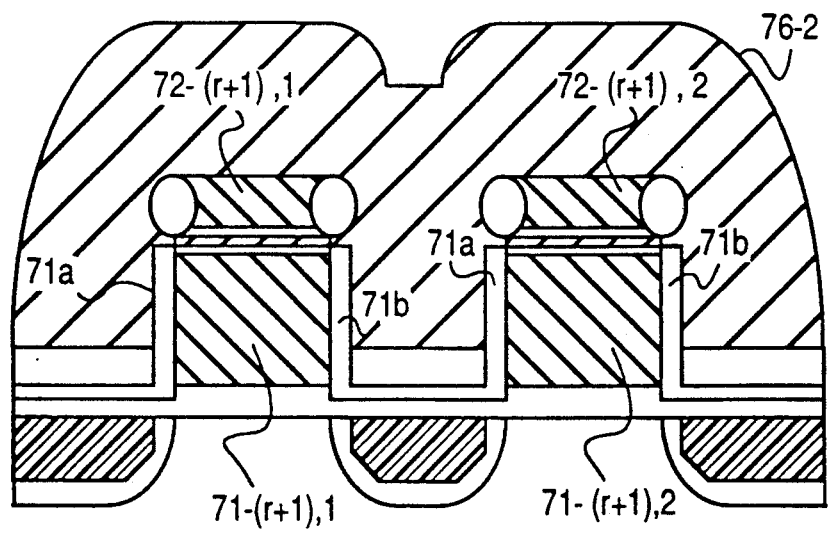

The resulting structure and cross-section appears as shown in FIGS. 7i with the silicide 76-2 in conductive contact with the polycrystalline silicon caps 72-r,1 and 72-r,2.

Figure 7J:
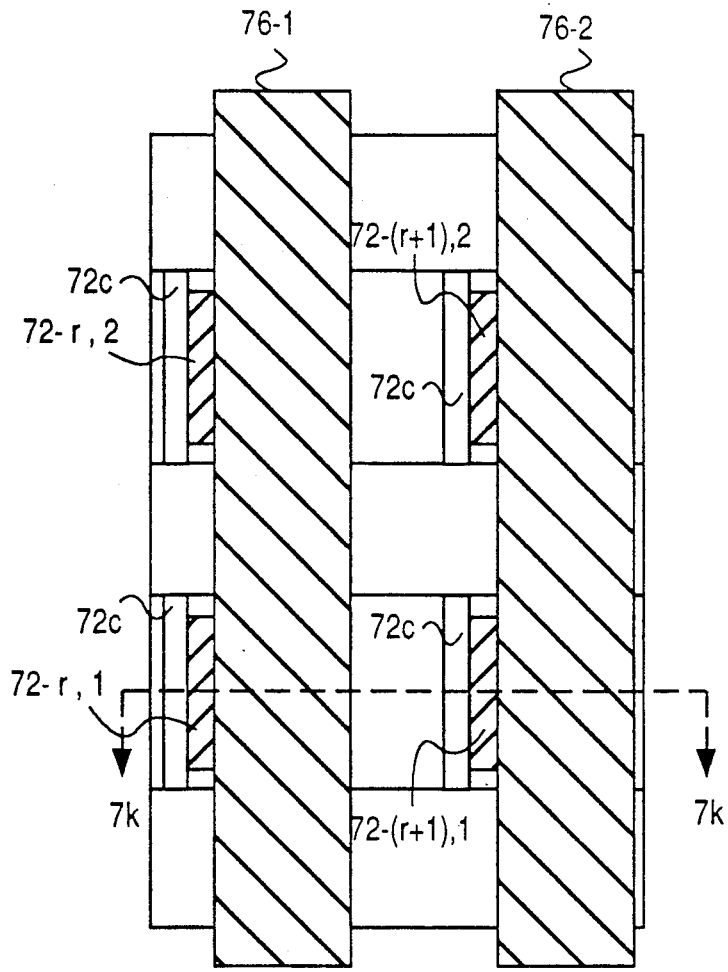
Figure 7K:
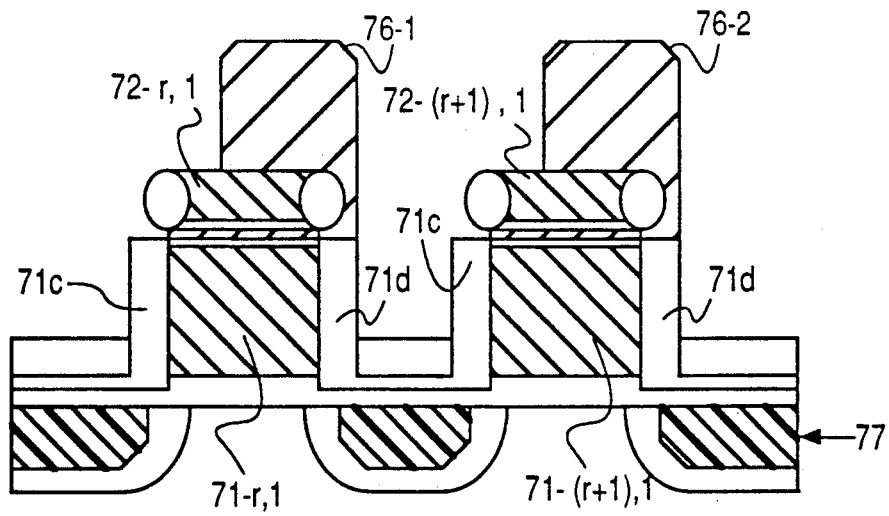

FIG. 7j comprises the plan view of FIG. 7h rotated counter-clockwise 90°. FIG. 7k is a cross-section through FIG. 7j as shown and shows the possibility of misalignment of the word lines 76-1 and 76-2 relative to the floating gate sections 71-r,1, 71-(r+1),1 shown in FIG. 7k. Silicide strip 76-1, 76-2 are shown as misaligned to the right of floating gate island 71-r,1, 71-(r+1),1. However, the maximum misalignment in the process is about plus or minus 0.25 micron. Since the floating gates 71-i together with the spacer oxide 71a, 71b have a thickness of about 1 to 1.2 microns, the silicide at most will misalign on the polycrystalline silicon cap 72 by a quarter of a micron and thus will still be in intimate contact with the underlying polycrystalline silicon cap material 72. Thus the cap material 72 provides a conductive contact to the silicide word lines and insures that the capacitive coupling between the word lines 76 and the underlying floating gates 71 is adequate.

If misalignment of the word line is such that it falls off the floating gate and contacts the field oxide, a possible leakage transistor will be created when the word line is raised to a high voltage. However, the leakage due to this unwanted transistor will be quite small for several reasons. First, the field oxide over the bit line is quite thick. Secondly, the field implant beneath the field oxide increases the threshold voltage required to turn on the unwanted parasitic transistor beneath the field oxide. Third, the thickness of the spilled-over portion of the word line is at most about 0.25 microns which is at most about 20% of the width of the actual floating gate transistor. Thus, the combination of all these effects means that any leakage current will be a very small percentage of the current through the floating gate transistor and will not be sufficient to cause inaccurate operation of the transistor and the array. The maximum leakage of the this parasitic transistor is about 5% of the leakage relative to a nonprogrammed transistor. This kind of leakage does not hurt the performance of the array and does not cause an erroneous reading.

The remaining processing is to remove the photoresist from the wafer and in particular from the periphery of the device and then reoxidize at 950° C. in a standard manner to form 400Å of oxide in the periphery. Next the source and drain implant masking photoresist layer is formed on the device and the N+ source and drains are implanted using first a phosphorus +31 ion at 75 kev to a dose of $8 \times 10^{15}$ atoms per square centimeter followed by an arsenic ion implant at 50 kev to a dose of $8.5 \times 10^{15}$ atoms per square centimeter.

The resist is then removed from the surface of the wafer. Then the source and drain are driven in at a temperature between 950° C. to 700° C. in a nitrogen environment and the P-type source and drain implants are carried out using boron difluoride (BF$_2$ at 80 kev to a dose of $4 \times 10^{15}$ atoms per square centimeter). This operation is followed by stripping the resist and then doing a low temperature oxidation to form 1000Å of oxide at about 390° C. Then the P+ source and drain regions are driven into the wafer at 900° C. for 20 minutes. Following this a borophosphosilicate glass (BPSG) is deposited to a thickness of 9000Å on the wafer. The BPSG glass yields good planarization over the surface.

Figure 8A:
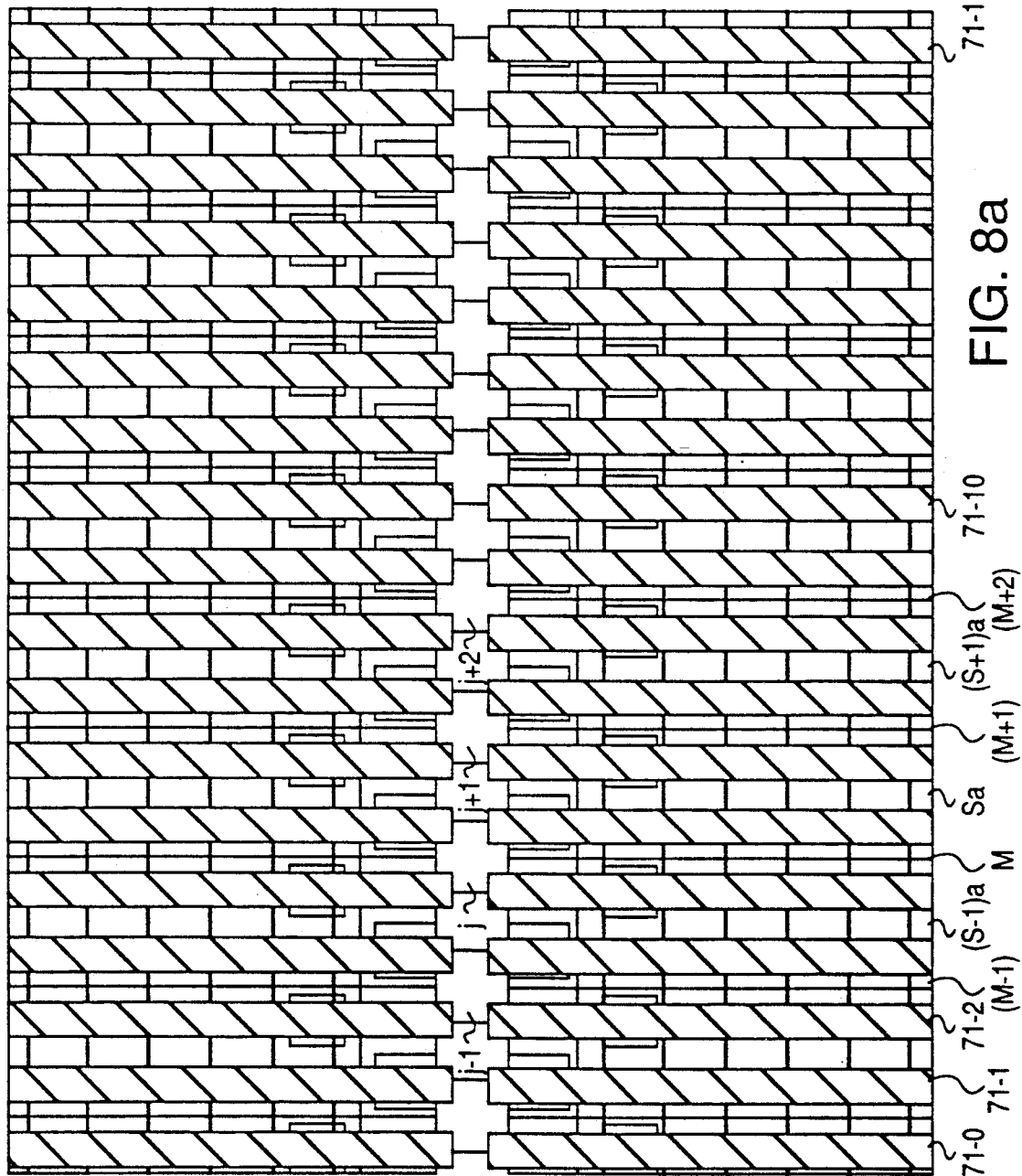
FIGS. 8a, 8b, 8c and 8d illustrate the layout of a portion of an array constructed in accordance with the principles of this invention.

FIG. 8a illustrates in plan view the array portion of the structure of this invention after poly 1 has been deposited and patterned into strips. Thus FIG. 8a shows in plan view the metal bit line diffusions (M−1), M, and (M+1). Also shown are the source bit line diffusions (S−1)a, Sa, and (S+1)a. (The portions of the array in which will be formed select transistors such as transistors QN2, QN4, QN6, Q(N+1)1, Q(N+1)3, and Q(N+1)5 will be masked with photoresist to prevent the implantation of impurities in these regions. Polycrystalline silicon strips 71-0 through 71-17 are shown on the wafer, together with the spacer oxide formed along the sides of strips 71-0 through 71-17 (as described above in conjunction with FIGS. 7a to 7k). The bit lines (for example (M−1), (S−1)a, M . . . (S+1)a . . . ) are self-aligned with the poly 1 silicon strips 71-0 through 71-17 before these strips are formed into floating gates.

Figure 8B:
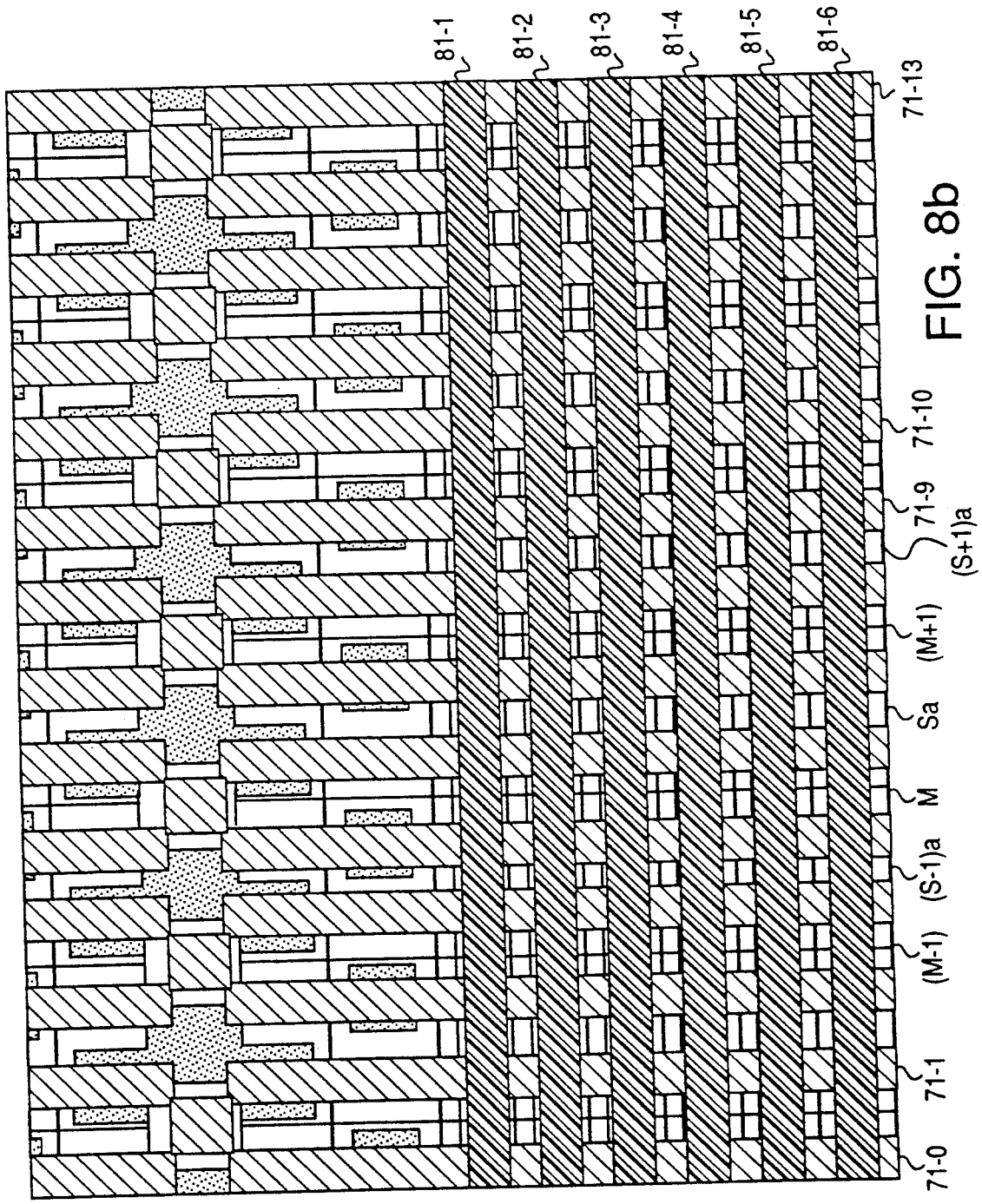

FIG. 8b illustrates the structure of FIG. 8a with horizontal strips of photoresist 81-1 through 81-6 placed over the wafer orthogonal to the vertical strips of poly 1 71-0 through 71-13. These photoresist strips 81-1 through 81-6 will be used to protect the underlying polycrystalline silicon from being removed during the etch of all the remaining poly 1 other than that beneath the photoresist to leave on the wafer the floating gates of the to-be-formed floating gate transistors.

Figure 8C:
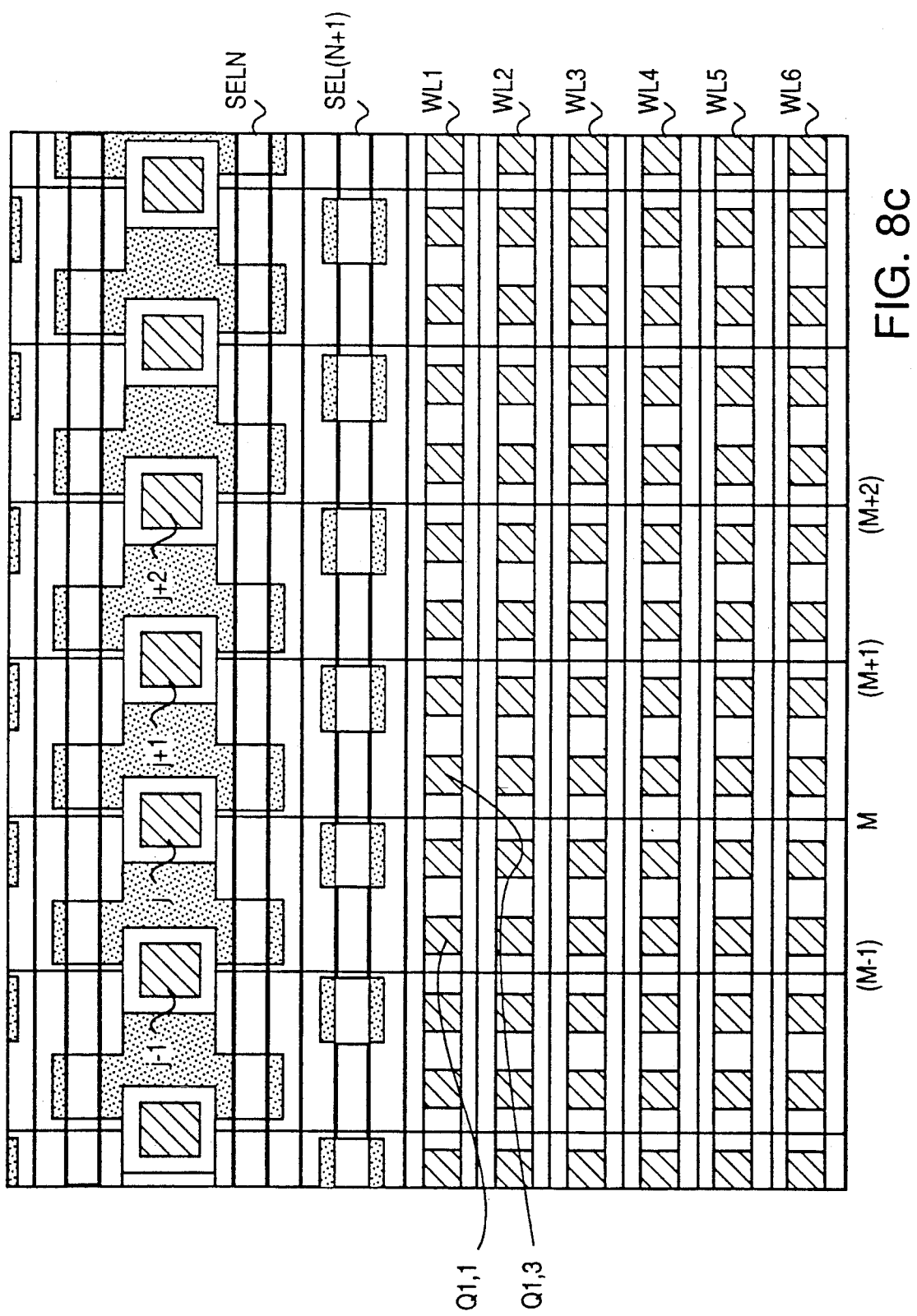

FIG. 8c illustrates the structure of FIG. 8b after the etch process and the removal of photoresist 81-1 through 81-6. The floating gates to be part of transistors Q1,1 and Q1,3 are specifically labeled on this figure. FIG. 8c also illustrates the structure of this invention with the metal contacts j−1, j, j+1 and j+2 contacting the metal bit lines (M−1), M, (M+1) and (M+2) respectively. Metal lines (M−1), M, (M+1) and (M+2) are formed after poly 2 and contact the underlying diffused bit lines shown by the same notations in FIG. 8a every N-transistor cells (N is 64 in the embodiment described in this invention). The select lines SELN and SEL(N+1) and word lines WL1 through WL6 are also shown in plan view in FIG. 8c.

Figure 8D:
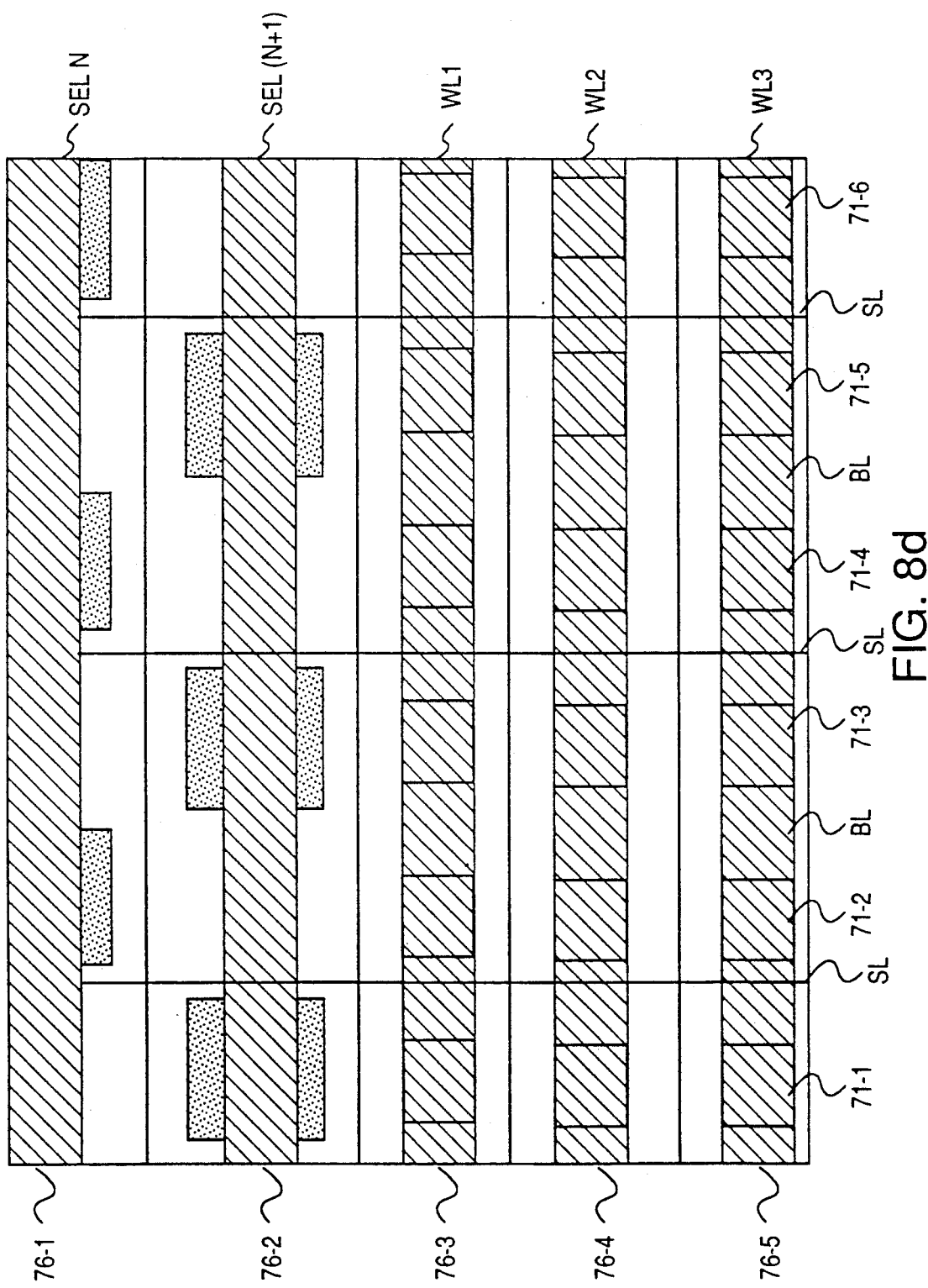

FIG. 8d is a plan view of a smaller portion of the structure of FIG. 8c with a second polycrystalline silicon (poly 2) layer formed over the top of the array perpendicular to poly 1 strips such as strips 76-1 through 76-5. Poly 2 strips 76-1 through 76-5 will, when covered with tungsten-silicide, form select lines such as SELN and SEL(N+1), as well as word lines WL1 through WL64 (see FIG. 6). As can be clearly seen from the plan view in FIG. 8d, the minimum cell size of each floating gate transistor of this array is limited by the pitch of poly 1 strips such as 71-1 through 71-5, and the pitch of the poly 2 strips comprising WL1, WL2 and WL3 for example. Thus the floating gate transistor comprising a memory cell in accordance with this invention is in fact the minimum size theoretically possible in accordance with this technology and the given design rules.

While this invention has been described in conjunction with one embodiment, other embodiments of this invention will be obvious in view of this disclosure to those skilled in the art.

What is claimed is:

1. The method of manufacturing a floating gate transistor in an array of such floating gate transistors comprising:
    forming a gate oxide on a silicon substrate;
    forming in a first direction on said gate oxide a plurality of strips of material, each strip comprising polycrystalline silicon covered by a selected dielectric covered by a cap of polycrystalline silicon;
    oxidizing the sides of the polycrystalline silicon portions of said plurality of strips to form silicon dioxide sidewalls on said sides of said strips;
    ion implanting the portion of the silicon substrate beneath the gate oxide between said strips to form diffused bitlines in said underlying silicon substrate;
    removing portions of the strips to form islands, each island comprising polycrystalline silicon covered by a selected dielectric covered by a cap of polycrystalline silicon;
    oxidizing the polycrystalline silicon portions of the sides, exposed by the removal of portions of the strips to form an oxide on said sides;
    forming field oxide in the portions of the semiconductor substrate exposed by removal of the portions of the strips; and
    forming over the tops of said islands a multiplicity of polycrystalline silicon strips from an additional polycrystalline silicon layer, said multiplicity of polycrystalline silicon strips being substantially orthogonal to said first set of strips.

2. The method of claim 1 wherein tungsten silicide is formed over the second set of strips to form with said second set of strips, word lines for use with said floating gate transistors.

3. The method of manufacturing a floating gate transistor in an array of such floating gate transistors comprising:
    forming a gate oxide on a semiconductor substrate;
    forming in a first direction on said gate oxide a plurality of strips of material, each strip comprising polycrystalline silicon covered by a selected dielectric covered by a conductive cap;
    forming an insulating material on the sides of the conductive portions of said plurality of strips;
    ion implanting the portion of the semiconductor substrate beneath the gate oxide between said strips to form diffused bitlines in said underlying semiconductor substrate;
    removing portions of the strips to form islands, each island comprising polycrystalline silicon covered by a selected dielectric covered by a conductive cap;
    forming an insulating material on the conductive portions of the sides exposed by the removal of portions of the strips;
    forming field oxide in the portions of the semiconductor substrate exposed by removal of the portions of the strips; and
    forming over the tops of said islands a multiplicity of conductive strips, said multiplicity of strips being substantially orthogonal to said first set of strips.

4. The method of claim 3 wherein said semiconductor substrate is silicon.

5. The method of claim 3 wherein said insulating material is a dielectric.

6. The method of claim 3 wherein tungsten silicide is formed over the second set of strips to form with said second strips, word lines for use with said floating gate transistors.

7. The method of manufacturing a floating gate transistor in an array of such floating gate transistors comprising:
    forming a gate oxide on a semiconductor substrate;
    forming in a first direction on said gate oxide a plurality of strips of material, each strip comprising a conductive material covered by a selected dielectric covered by a conductive cap;
    forming an insulating material on the sides of the conductive portions of said plurality of strips;
    removing portions of the strips to form islands, each island comprising a conductive material covered by a selected dielectric covered by a conductive cap;
    forming an insulating material on the conductive portions of the sides exposed by the removal of portions of the strips; and
    forming over the tops of said islands a multiplicity of conductive strips.

8. The method of manufacturing a floating gate transistor in an array of such floating gate transistors comprising:

forming a gate oxide on a semiconductor substrate;

forming an array of islands on said gate oxide, each island comprised of a floating gate covered by a selected dielectric and a conductive cap aligned with the underlying floating gate;

forming an insulating material around the sides of each floating gate and the conductive cap; and forming over the conductive caps of said islands a multiplicity of conductive strips to form word lines contacting said conductive caps thereby to insure a consistent capacitive coupling between said word lines and each floating gate despite any partial misalignment of said multiplicity of conductive strips to said islands.

* * * * *